US010404252B2

(12) United States Patent
Seki

(10) Patent No.: US 10,404,252 B2
(45) Date of Patent: Sep. 3, 2019

(54) BIDIRECTIONAL SWITCH CIRCUIT AND SWITCH DEVICE

(71) Applicant: Murata Manufacturing Co., Ltd., Kyoto (JP)

(72) Inventor: Kenta Seki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/001,020

(22) Filed: Jun. 6, 2018

(65) Prior Publication Data
US 2018/0358964 A1  Dec. 13, 2018

(30) Foreign Application Priority Data

Jun. 7, 2017  (JP) ................. 2017-112650

(51) Int. Cl.
| | |
|---|---|
| H03K 17/693 | (2006.01) |
| H03K 17/687 | (2006.01) |
| H03K 17/06 | (2006.01) |
| H01L 23/522 | (2006.01) |
| H01L 27/06 | (2006.01) |
| H03H 11/28 | (2006.01) |
| H03K 17/10 | (2006.01) |
| H04B 1/52 | (2015.01) |

(52) U.S. Cl.
CPC ....... *H03K 17/693* (2013.01); *H01L 23/5223* (2013.01); *H01L 27/0629* (2013.01); *H03H 11/28* (2013.01); *H03K 17/063* (2013.01); *H03K 17/102* (2013.01); *H03K 17/6871* (2013.01); *H03K 2217/0054* (2013.01); *H04B 1/52* (2013.01)

(58) Field of Classification Search
None
See application file for complete search history.

(56) References Cited

U.S. PATENT DOCUMENTS

| | | | |
|---|---|---|---|
| 9,106,227 B2 | 8/2015 | Ranta et al. | |
| 9,484,973 B1 | 11/2016 | Carroll et al. | |
| 9,825,545 B2 * | 11/2017 | Chen ................. | H02M 3/335 |
| 2006/0160520 A1 | 7/2006 | Miyazawa | |
| 2014/0165385 A1 | 6/2014 | Englekirk | |

(Continued)

FOREIGN PATENT DOCUMENTS

| | | |
|---|---|---|
| JP | 2005-203643 A | 7/2005 |
| JP | 2013-102508 A | 5/2013 |

*Primary Examiner* — Cassandra F Cox
(74) *Attorney, Agent, or Firm* — Pearne & Gordon LLP

(57) ABSTRACT

A bidirectional switch circuit is constituted of an FET group encompassing FETs of L stages (L≥3) connected in series to each other and includes an FET group configured to control electric conduction for a signal in both directions between one end and the other end of the above-mentioned FET group and a plurality of capacitance elements. The FET group includes a first FET closest to the one end and a second FET closest to the other end. The plurality of capacitance elements encompass a first capacitance element group including capacitance elements of M stages (1≤M<L) connected in parallel to each of the FETs from the first FET in sequence, and a second capacitance element group including capacitance elements of N stages (1≤N≤(L−M)) connected in parallel to each of the FETs from the second FET in sequence.

18 Claims, 5 Drawing Sheets

(56) References Cited

U.S. PATENT DOCUMENTS

2016/0380546 A1* 12/2016 Wang .................... H02M 7/217
                                                363/21.12
2017/0237339 A1*  8/2017 Young ................... H02M 1/38
                                                363/126

* cited by examiner

BIDIRECTIONAL SWITCH CIRCUIT AND SWITCH DEVICE

This application claims priority from Japanese Patent Application No. 2017-112650 filed on Jun. 7, 2017. The content of this application is incorporated herein by reference in its entirety.

BACKGROUND

The present disclosure relates to bidirectional switch circuits and switch devices.

In a switch circuit mounted in a mobile communication device such as a cellular phone, field-effect transistors (FETs) are used, for example. For use in the switch circuit constituted of FETs, such a configuration is well-known that a plurality of FETs are connected in multiple stages (multistage-connected) to improve withstand voltage of the switch circuit in order to handle a relatively high input voltage. In the above configuration, because a voltage divided by the number of stages of the multistage-connected FETs is applied across a source and a drain of each FET, a permissible input voltage can be set in accordance with the number of stages of the FETs.

In this case, since each FET has parasitic capacitance, the voltage of a signal supplied to an input terminal is not equally divided due to the influence of the parasitic capacitance. Because of this, such a phenomenon is generated that a voltage applied across the source and drain of each FET becomes gradually larger from an output terminal side toward the input terminal side. In this case, a voltage exceeding the withstand voltage is applied across the source and drain of each of the FETs relatively close to the input terminal, which raises a risk of breakdown of the FETs. As such, it is preferable to resolve the un-uniformity of the voltage applied across the source and drain of each of the FETs in order to prevent the breakdown of the FETs due to the increase in input voltage in the switch circuit.

For example, U.S. Pat. No. 9,106,227 discloses a configuration in which voltage is equally supplied across the source and drain of each FET by additionally providing capacitance elements connected in parallel over some FETs that are continuously connected from the FET closest to one terminal. In this configuration, the source of the FET closest to the one terminal (that is, the terminal where the amplitude of a voltage derived from an input signal is relatively large) and the drain of each of the FETs are directly connected to each other so as to raise the drain voltage of each FET, thereby solving the un-uniformity of the voltage across the source and drain. Moreover, in the stated configuration, capacitance elements are additionally provided in parallel over some FETs that are continuously connected from the other terminal in a similar manner. This makes it possible to resolve the un-uniformity of the voltage across the source and drain of each of the FETs regardless of whether the signal is supplied from the one terminal or from the other terminal.

According to the configuration disclosed in U.S. Pat. No. 9,106,227, because the additionally provided capacitance elements are connected from the FET closest to the one terminal or from the FET closest to the other terminal, capacitance values of each of the capacitance elements can become relatively large, thereby raising a problem that characteristics of insertion loss, isolation, or the like are degraded when the switch circuit is turned off.

BRIEF SUMMARY

Accordingly, the present disclosure provides a bidirectional switch circuit capable of enhancing the withstand voltage while suppressing the degradation in characteristics.

A bidirectional switch circuit according to an aspect of the present disclosure is constituted of at least L stages of field-effect transistors (FETs) connected in series with each other between a first terminal and a second terminal, and configured to control electric conduction of a signal in both directions between the first terminal and the second terminal; and a plurality of capacitance elements, wherein: L is at least three, the at least L stages of FETs includes a first FET that is closest to the first terminal and a second FET that is closest to the second terminal, the plurality of capacitance elements comprises a first capacitance element connected in parallel with the first FET, and a second capacitance element connected in parallel with the second FET, and capacitance values of the plurality of capacitance elements are greatest for capacitance elements closest to the first and second terminals.

Other features, elements, characteristics and advantages of the present disclosure will become more apparent from the following detailed description of preferred embodiments of the present disclosure with reference to the attached drawings.

DETAILED DESCRIPTION

Hereinafter, an embodiment of the present disclosure will be described with reference to the drawings. Note that the same constituent elements are assigned identical reference signs and redundant description thereof will be omitted.

Figure 1:
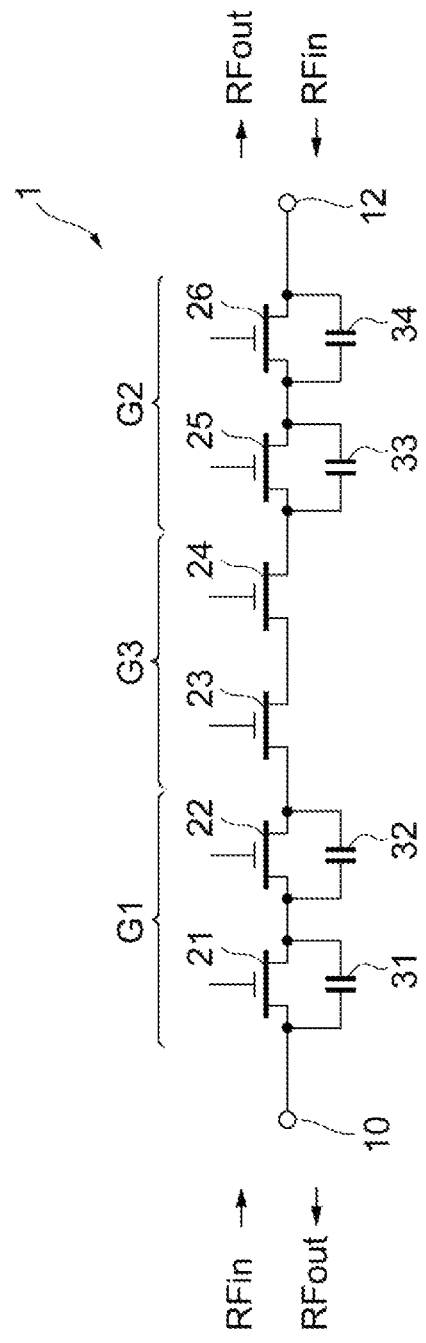
FIG. 1 is a diagram illustrating an example of a configuration of a bidirectional switch circuit according to an embodiment of the present disclosure.
Figure 2:
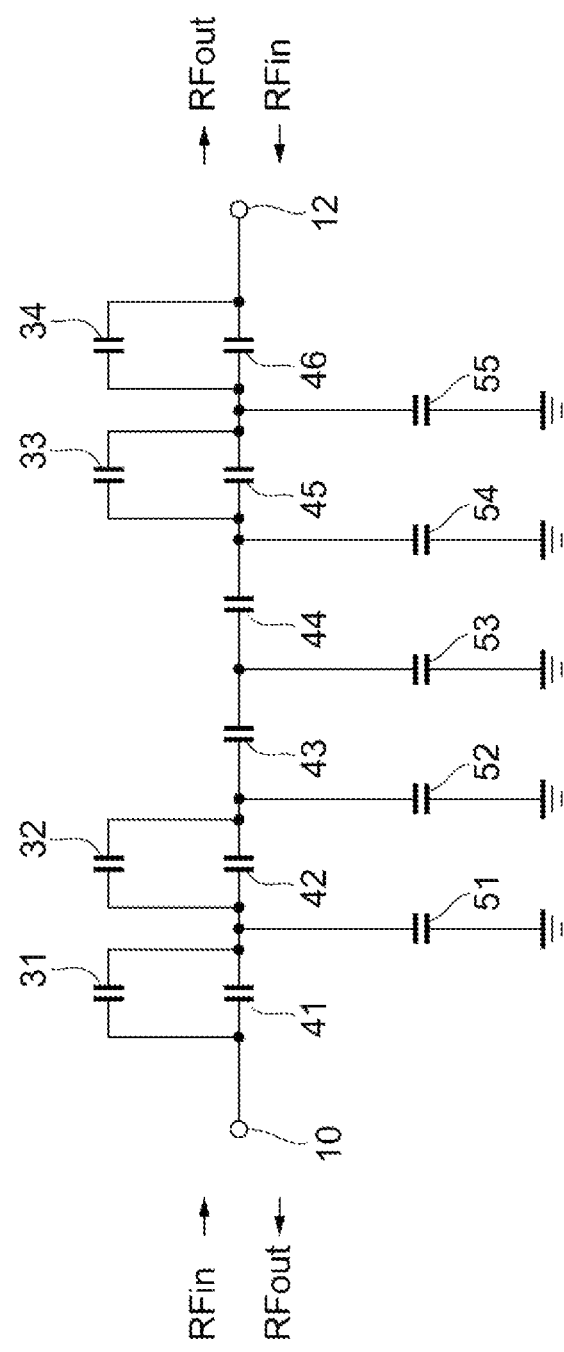
FIG. 2 is a diagram illustrating an equivalent circuit diagram of the bidirectional switch circuit illustrated in FIG. 1.

FIG. 1 is a diagram illustrating an example of a configuration of a bidirectional switch circuit 1 according to an embodiment of the present disclosure, and FIG. 2 is a diagram illustrating an equivalent circuit of the bidirectional switch circuit 1 illustrated in FIG. 1. Although a device in which the bidirectional switch circuit 1 is used is not limited to any specific device, the description in this specification is based on an assumption that the bidirectional switch circuit 1 is used in a power amplification module mounted in a mobile communication device such as a cellular phone, as an example. To be more specific, for example, the bidirectional switch circuit 1 may be used as a switch to control electric conduction for a radio frequency (RF) signal at a frequency of around a few GHz from a terminal to another terminal. In particular, in order to permit a high input voltage as explained later, the bidirectional switch circuit 1 may be used as a band-switching switch, an antenna switch, or the like that is provided between a power amplifier and an antenna (that is, in a signal path for the RF signal having been amplified by the power amplifier). Details of an application example of the bidirectional switch circuit 1 will be explained later.

As illustrated in FIG. 1, the bidirectional switch circuit 1 includes, for example, terminals 10 and 12, FETs 21 to 26 of six stages, and capacitance elements 31 to 34 of four stages. The above numbers of stages of the FETs and capacitance elements are exemplary and the actual number of stages of the FETs and the actual number of stages of the capacitance elements are not limited thereto. In the following description, an N-channel MOSFET (Metal-oxide-semiconductor Field-Effect Transistor) is used as an example of each FET. Although the same effect can be obtained with a configuration using a P-channel MOSFET for each FET, detailed description thereof is omitted because the configuration using P-channel MOSFETs is similar to the configuration using N-channel MOSFETs.

The FETs 21 to 26 of six stages are multistage-connected between the terminal 10 (one end) and the terminal 12 (the other end). Specifically, from the FET 21 (a first FET) closest to the terminal 10 to the FET 26 (a second FET) closest to the terminal 12, the drain and the source of adjacent FETs are connected consecutively so that the FETs of six stages are connected in series. The FETs of six stages configure one FET group. In the following description, the FETs 21 and 22 of two stages counted from the FET 21 closest to the terminal 10 are called an FET group G1 (a first FET group), the FETs 26 and 25 of two stages counted from the FET 26 closest to the terminal 12 are called an FET group G2 (a second FET group), and the FETs 23 and 24 of two stages connected between the FET group G1 and the FET group G2 are called an FET group G3 (a third FET group).

Although not illustrated, a control voltage is applied to each gate of the FETs 21 to 26. A path between the terminal 10 and the terminal 12 becomes conductive when all the FETs are turned on in response to the stated control voltage. At this time, in a case where an input signal RFin is supplied from the terminal 10, an output signal RFout is outputted from the terminal 12 through the FETs 21 to 26. In a case where the input signal RFin is supplied from the terminal 12, the output signal RFout is outputted from the terminal 10 through the FETs 26 to 21. Meanwhile, when at least the FET of one stage among the FETs 21 to 26 is turned off, the path between the terminal 10 and the terminal 12 is not conductive so that the output signal is not outputted from the bidirectional switch circuit 1. In this manner, the bidirectional switch circuit 1 controls electric conduction for the signal between the terminal 10 and the terminal 12 in both directions, for example. In the following, a case in which an RF signal is supplied from the terminal 10 and outputted from the terminal 12 is cited and described as an example.

As illustrated in FIG. 2, the FETs 21 to 26 in an off-state are equivalently expressed as capacitance elements 41 to 46 of six stages connected in series to each other. Further, parasitic capacitance of each of the FETs is equivalently expressed as capacitance elements 51 to 55, in which one ends thereof are each connected to the signal path and the other ends thereof are each connected to the ground. As such, in a case where the bidirectional switch circuit is not provided with the capacitance elements 31 to 34 to be explained later in detail, when a voltage is applied to the terminal 10, voltages applied to the capacitance elements 41 to 46 respectively (in other words, voltages applied across the source and drain of each of the FETs 21 to 26 respectively) become imbalanced due to the influence of the capacitance elements 51 to 55 (in other words, the parasitic capacitance of each of the FETs 21 to 26). To be specific, because impedance observed from the terminal 10 side toward the terminal 12 side is larger as the observation position is closer to the terminal 10, a voltage applied across the source and drain of the FET gets higher as the position of the FET is closer to the terminal 10. As such, a permissible input voltage of the bidirectional switch circuit is limited by the withstand voltage of the FET 21 closest to the terminal 10. For example, in a case where the withstand voltage of the FET of one stage is about 4 V, when the FETs of six stages are connected in series, the permissible voltage is ideally about 24 V (4×6=24) as a whole. However, in reality, the permissible voltage is suppressed to, for example, about 16 V due to the imbalance of the respective voltage across the source and drain of each of the FETs. In contrast, in the bidirectional switch circuit 1, the capacitance elements 31 to 34 are each additionally connected in parallel to some of the FETs across the source and drain thereof, thereby making it possible to suppress an increase in respective voltage across the source and drain of the FETs that are close in position to the terminal from which the RF signal is supplied. The capacitance elements 31 to 34 will be described in detail below.

The capacitance elements 31 to 34 are each connected in parallel across the source and drain of each of the FETs included in the FET groups G1 and G2. In the following description, for the sake of convenience in explanation, although the element connected across the source and drain of the FET is referred to as "capacitance element", the stated element is not absolutely necessary to be an "element", and includes other configurations having a function similar to that of the "capacitance element" by accumulating electric charge as explained later. The capacitance elements 31 and 32 (a first capacitance element group) are connected in parallel to the FETs 21 and 22 respectively, and the capacitance elements 33 and 34 (a second capacitance element group) are connected in parallel to the FETs 25 and 26 respectively. Adjusting the capacitance values of the capacitance elements 31 to 34 makes it possible to compensate for a difference in impedance due to the parasitic capacitance.

To be specific, for example, the capacitance value of the capacitance element 31 is larger than that of the capacitance element 32. This makes it possible to suppress a rise in voltage across the source and drain of each of the FETs 21 and 22 that are close to the terminal 10 when the RF signal is supplied from the terminal 10. Likewise, the capacitance value of the capacitance element 34 is larger than that of the capacitance element 33. This makes it possible to suppress a rise in voltage across the source and drain of each of the FETs 26 and 25 that are close to the terminal 12 when the RF signal is supplied from the terminal 12.

Here, in the case where the number of stages of the FETs is assumed to be L stages (L is at least three), the number of stages of the capacitance elements connected to the FETs included in the FET group G1 is assumed to be M stages (M is at least one and less than L, in other words, M is an integer no less than one and less than L), and the number of stages of the capacitance elements connected to the FETs included in the FET group G2 is assumed to be N stages (N is at least one and no greater than L−M, in other words, M is an integer no less than one and no greater than a value of (L−M)), the present embodiment satisfies a relation of M equals N.

Further, the capacitance value of the k-th capacitance element (k is at least one and no more than M, specifically, k is an arbitrary integer no less than one and no more than M) counted from the terminal 10 side is substantially equal to the capacitance value of the k-th capacitance element counted from the terminal 12 side. In other words, the capacitance value of the capacitance element 31 as the first capacitance element counted from the terminal 10 and the capacitance value of the capacitance element 34 as the first capacitance element counted from the terminal 12 are substantially equal to each other, and the capacitance value of the capacitance element 32 as the second capacitance element counted from the terminal 10 and the capacitance value of the capacitance element 33 as the second capacitance element counted from the terminal 12 are substantially equal to each other. Here, the expression "substantially equal to each other" is not intended to express only a case in which the capacitance values of the k-th capacitance elements counted from the terminals 10 and 12 respectively are strictly equal to each other but is intended to mean that these capacitance values are almost equal including errors due to variations in manufacturing or the like that can be generated during the manufacture of the bidirectional switch circuit, for example. Specifically, for example, the capacitance value of each of the capacitance elements 31 and 34 may be about 40 fF, and the capacitance value of each of the capacitance elements 32 and 33 may be about 20 fF. That is to say, the capacitance values of the capacitance elements are adjusted to be symmetric with respect to the center of the plurality of FETs connected from the terminal 10 to the terminal 12 (a node between the FETs 23 and 24 in the example illustrated in FIG. 1) as a reference position, toward the terminal 10 side and the terminal 12 side. With this, in the case where the RF signal is supplied in both directions, a rise in voltage across the source and drain of each of the FETs that is close to the terminal from which the RF signal is supplied can be equally suppressed in any of the directions, thereby making it possible to enhance the withstand voltage.

Meanwhile, in the configuration disclosed in U.S. Pat. No. 9,106,227 (hereinafter, also referred to as the known example), all the capacitance elements are directly connected from the FET close to any one of both terminals. This increases the total of capacitance values of the added capacitance elements, whereby characteristics of insertion loss of the bidirectional switch circuit, isolation or the like may be degraded, or an increase in size of the circuit may be brought about. In contrast, in the bidirectional switch circuit 1, since the individual capacitance elements are connected in parallel to each of the FETs, the total of capacitance values of the added capacitance elements can be reduced in comparison with the known example. As such, according to the bidirectional switch circuit 1, the withstand voltage in both directions can be enhanced while suppressing the degradation in characteristics, the increase in size of the circuit, and the like in comparison with the known example.

As illustrated in FIG. 1, the bidirectional switch circuit 1 includes, in the vicinity of the center of the plurality of FETs, the FET group G3 to which no capacitance element is connected in parallel. To rephrase, a relation of L>(M+N) is satisfied. As discussed above, it is not absolutely necessary for the capacitance elements to be connected in parallel to all the FETs, and it is sufficient that the capacitance elements are connected to several FETs counted from the terminal 10 and the terminal 12 respectively. Moreover, the number of stages of the FETs to which no capacitance element is connected in parallel is not limited to two stages and may be one stage or may be no less than three stages. Alternatively, the capacitance elements may be connected in parallel to all the FETs.

Further, the number of stages of the FETs and the number of stages of the capacitance elements are not limited to any specific values, and it is sufficient that each of the capacitance elements connected to the FET group G1 has a larger capacitance value as the position thereof is closer to the terminal 10, and each of the capacitance elements connected to the FET group G2 has a larger capacitance value as the position thereof is closer to the terminal 12. For example, of the capacitance elements connected to the FET group G1, the k-th capacitance element (k is at least one and no more than M, specifically, k is at least one integer no less than one and no more than M) counted from the terminal 10 side has a capacitance value substantially equal to that of the k-th capacitance element counted from the terminal 12 side, and the other capacitance elements may have different capacitance values from those of the corresponding capacitance elements connected to the FET group G2. Alternatively, all the capacitance elements connected to the FET group G1 may have different capacitance values from those of the corresponding capacitance elements connected to the FET group G2. In other words, the capacitance values of the capacitance elements may be adjusted to be asymmetric with respect to the center of the plurality of FETs connected from the terminal 10 to the terminal 12 as a reference position, toward the terminal 10 side and the terminal 12 side.

Further, for the multistage-connected FETs, individual FETs may be connected in series as illustrated in FIG. 1, or multi-gate FETs may be used.

The FETs 21 to 26 are not limited to MOSFETs and may be FETs such as JFETs (Junction Field-Effect Transistors) or MOSFETs (Metal-semiconductor Field-Effect Transistors), for example.

Figure 3:
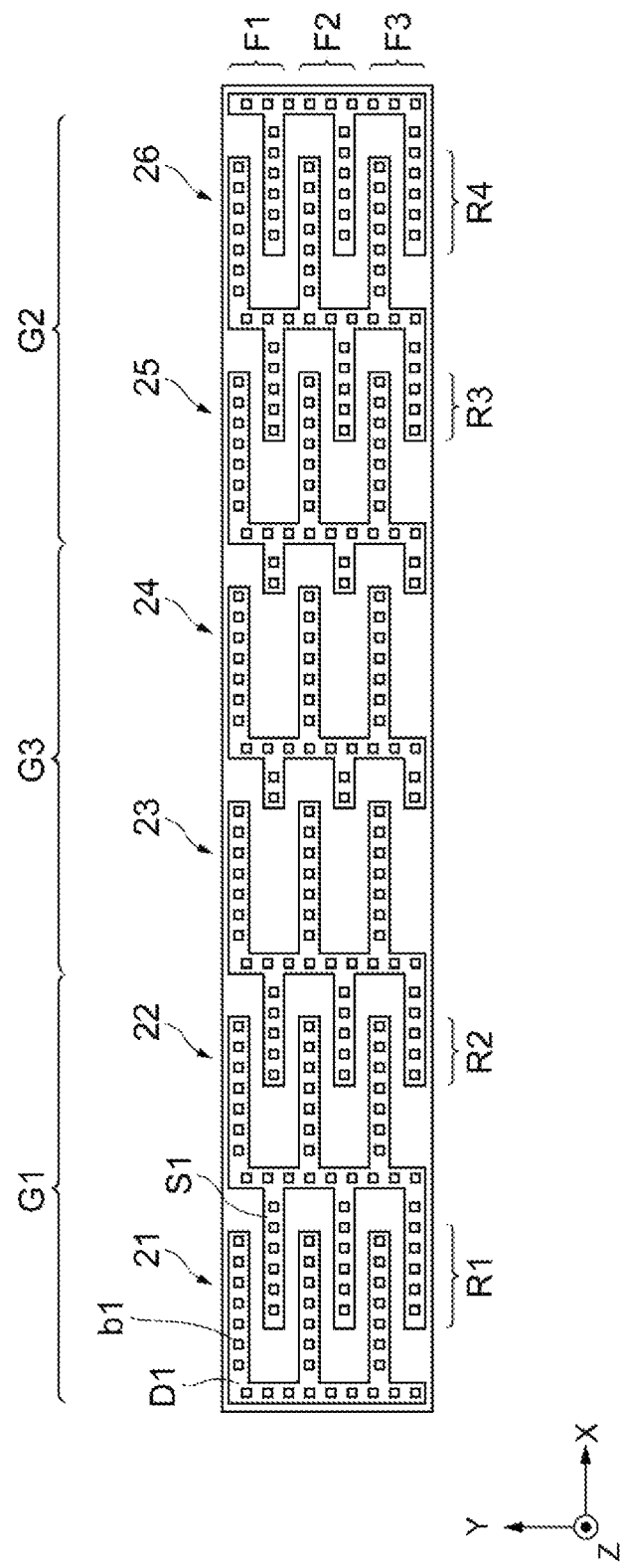
FIG. 3 is a plan view schematically illustrating part of layout of the bidirectional switch circuit according to an embodiment of the present disclosure.

Next, an example of layout of the bidirectional switch circuit 1 will be described with reference to FIG. 3. FIG. 3 is a plan view schematically illustrating part of the layout of the bidirectional switch circuit 1 according to the embodiment of the present disclosure. In FIG. 3, for the sake of convenience in explanation, constituent elements corresponding to those of the bidirectional switch circuit 1 are given the same reference signs as the reference signs used in the above explanation, and description of such constituent elements is omitted. Further, the plan view illustrated in FIG. 3 describes part of the bidirectional switch circuit 1 in a plan view of a principal surface of a substrate (viewed in a direction perpendicular to the principal surface of the substrate) where the bidirectional switch circuit 1 is formed, and the number of stages of FETs and the number of fingers of the FETs are not limited thereto.

The bidirectional switch circuit 1 is formed on the substrate (not illustrated) having the principal surface parallel to an X-Y plane that is defined by an X-axis and a Y-axis orthogonal to each other. The FET group in the bidirectional switch circuit 1 is configured by the plurality of FETs 21 to 26 arranged in sequence along an X-axis direction on the principal surface of the substrate. Each stage of the FETs is configured of a plurality of fingers F1 to F3 arranged along a Y-axis direction. The FETs 21 to 26 are connected in series with electrodes formed on the FETs 21 to 26.

To be specific, when the FET 21 is taken as an example, a drain electrode D1 extends along the Y-axis direction to electrically connect the drain configured of a plurality of fingers, and each of the fingers extends along a positive X-axis direction (a first direction) from the terminal 10 side toward the terminal 12 side. Meanwhile, a source electrode S1 extends along the Y-axis direction to electrically connect the source configured of a plurality of fingers, and each of the fingers extends along a negative X-axis direction (an opposite direction to the first direction) from the terminal 12 side toward the terminal 10 side. A plurality of vias b1 are formed in the drain electrode D1 and the source electrode S1 for establishing electrical conduction with the drain and the source of the FET. The source electrode S1 also serves as the drain electrode of the FET 22 adjacent to the FET 21. In the manner as discussed above, electrodes are also disposed in the FETs 22 to 26 like in the FET 21. Note that the gate electrode (not illustrated) is, for example, formed in a different layer from those of the drain electrode D1 and the source electrode S1.

In the FET 21, the drain electrode D1 and the source electrode S1 respectively extend in parallel to the X-axis direction. With this, a region R1 in which the drain electrode D1 and the source electrode S1 overlap with each other in a positive Y-axis direction (a second direction) is formed (hereinafter, the stated region is also referred to as an "overlap region"). Electric charge is accumulated between the drain electrode D1 and the source electrode S1 in the overlap region R1, whereby the overlap region R1 comes to have a function similar to that of a capacitance element. As such, with the overlap region R1, the capacitance element 31 as illustrated in FIG. 1 is formed. Likewise, in the FETs 22, 25, and 26, overlap regions R2, R3, and R4 are formed between the drain electrode and the source electrode.

The capacitance values of the capacitance elements 31 to 34 are adjusted in accordance with widths of the overlap regions R1 to R4, which are lengths of the overlap regions R1 to R4 in a direction parallel to the X-axis direction. That is, lengths of the drain electrodes and the source electrodes in the direction parallel to the X-axis direction are longer as the electrode is closer in position to the terminal 10 in the FET group G1, and longer as the electrode is closer to the terminal 12 in the FET group G2. In other words, a widths of the overlap region is greater for the capacitance elements 31 to 34, which are formed by the FETs 21,22,25, and 26, closer to the first and second terminals 10 and 12. This makes it possible to cause the capacitance value of the capacitance element connected to the FET to be larger as the FET to which the stated capacitance element is connected is closer to the terminal in each of the FET groups G1 and G2. In addition, the length of the overlap region R1 as the first overlap region counted from the terminal 10 side is substantially equal to the length of the overlap region R4 as the first overlap region counted from the terminal 12 side, and the length of the overlap region R2 as the second overlap region counted from the terminal 10 side is substantially equal to the length of the region R3 as the second overlap region counted from the terminal 12 side. Such a configuration can also be prepared that no capacitance element is added across the source and drain, like the configuration of the FETs 23 and 24 included in the FET group G3, by not forming an overlap region.

As discussed above, by adjusting the capacitance values in accordance with the widths of the overlap regions (the lengths of the drain electrodes and the source electrodes in the direction parallel to the X-axis direction), the bidirectional switch circuit 1 can be relatively easily formed from a configuration in which the capacitance elements 31 to 34 are not included, while suppressing an increase in the circuit area.

Although an example in which the FETs 21 to 26 are arranged in a row is illustrated in FIG. 3, it is not absolutely necessary for the FETs 21 to 26 to be arranged in a row. In particular, since the capacitance elements 31 to 34 are formed on the corresponding FETs in the embodiment of the present disclosure, the FETs may be disposed separate from each other. That is, the degree of freedom in layout of the FETs 21 to 26 is larger in the embodiment of the present disclosure in comparison with the known example.

Figure 4:
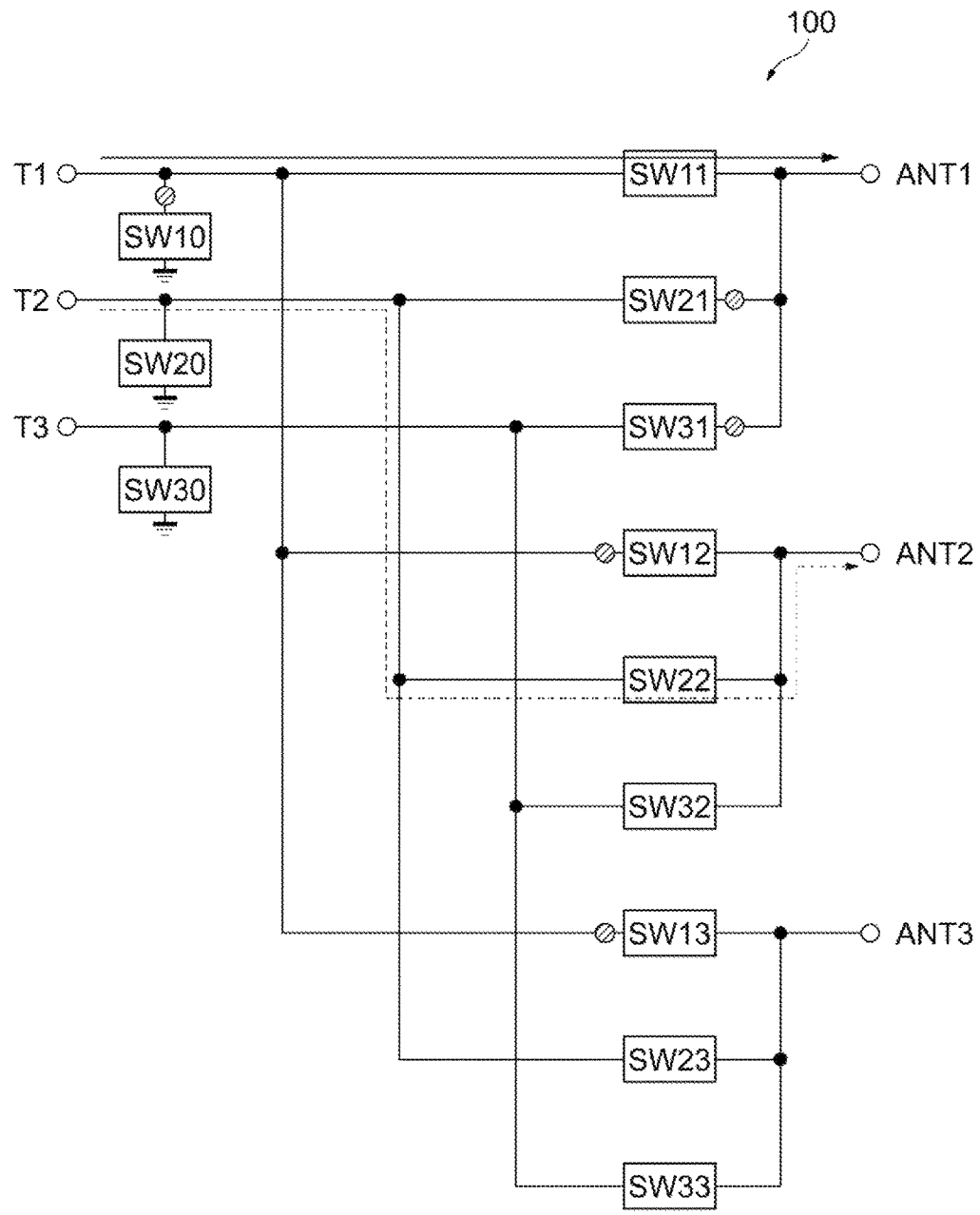
FIG. 4 is a diagram illustrating an example of a configuration to which the bidirectional switch circuit according to an embodiment of the present disclosure is applied.
Figure 5:
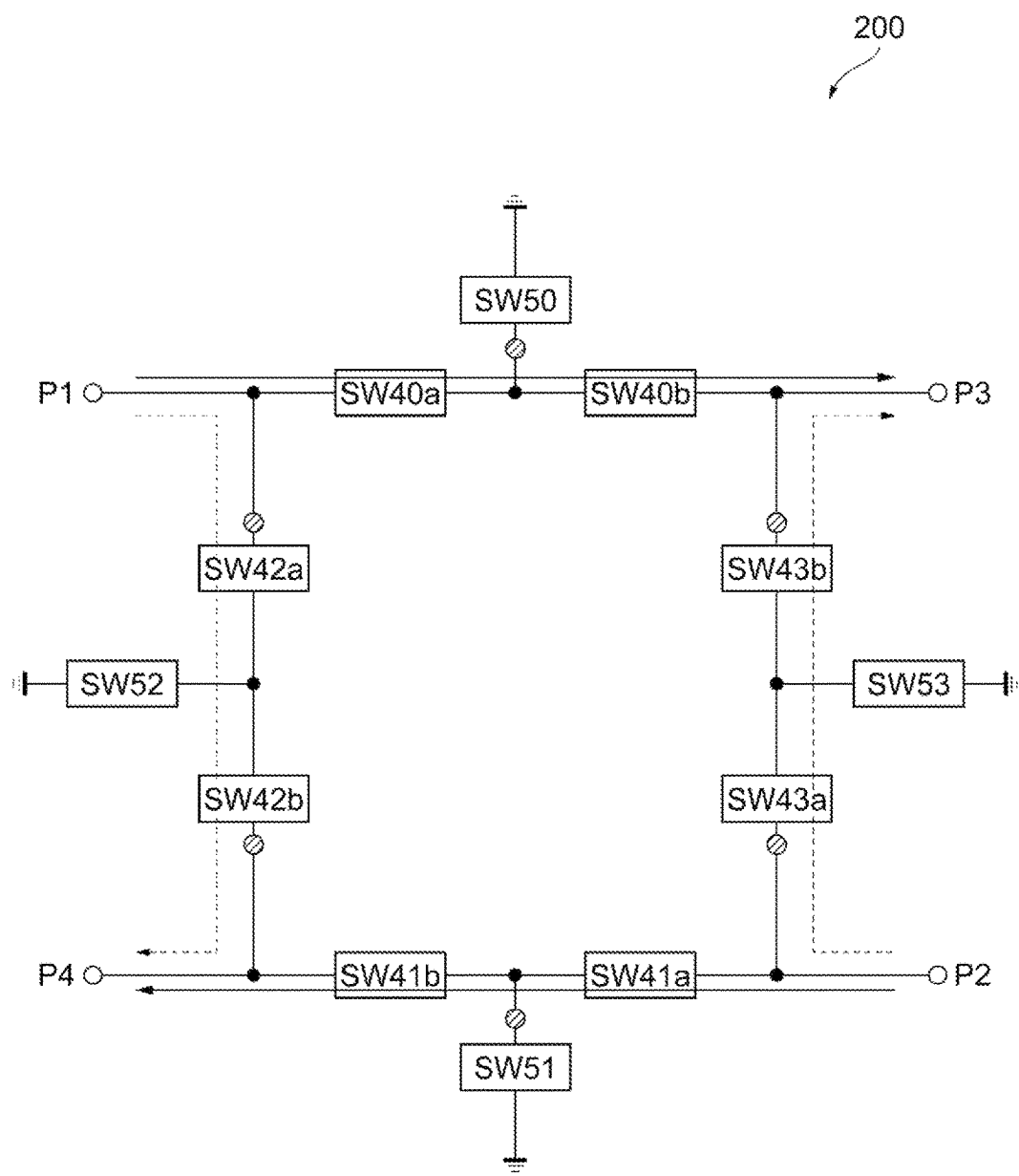
FIG. 5 is a diagram illustrating another example of a configuration to which the bidirectional switch circuit according to an embodiment of the present disclosure is applied.

Next, application examples of the bidirectional switch circuit 1 will be described below with reference to FIGS. 4 and 5. FIG. 4 is a diagram illustrating an example of a configuration to which the bidirectional switch circuit 1 according to the embodiment of the present disclosure is applied, and FIG. 5 is a diagram illustrating another example of a configuration to which the bidirectional switch circuit 1 according to the embodiment of the present disclosure is applied.

FIG. 4 illustrates an example of a case in which the bidirectional switch circuit 1 is applied to a three-input three-output (3-Pole 3-Throw (3P3T)) switch including three input terminals, three output terminals, and nine paths. A switch device 100 distributes a transmission signal, supplied by a transmission circuit (not illustrated), from terminals T1 to T3 to one of terminals ANT1 to ANT3 while making a path to the above one of the terminals ANT1 to ANT3 conductive for the transmission signal, and then outputs the signal to an antenna (not illustrated). Further, the switch device 100 distributes a reception signal, received by the antenna, from the terminals ANT1 to ANT3 to one of the terminals T1 to T3 while making a path to the above one of the terminals T1 to T3 conductive for the reception signal, and then outputs the signal to a reception circuit (not illustrated). In this manner, the switch device 100 allows the signals to travel in conductive paths in both directions.

Specifically, the switch device 100 includes switch circuits SW11 to SW13, SW21 to SW23, SW31 to SW33, SW10, SW20, and SW30. In a case where, for example, the switch device 100 allows a transmission signal to travel in a conductive path from the terminal T1 to the terminal ANT1 (see a solid-line arrow mark in FIG. 4), only the switch circuit SW11 is turned on while the other switch circuits are turned off. At this time, since an RF signal attempts to flow into the terminal T1 side of the switch circuits SW12 and SW13, the terminal ANT1 side of the switch circuits SW21 and SW31, and the terminal T1 side of the switch circuit SW10, relatively large voltages are applied thereto (see circle marks in FIG. 4). Likewise, in a case where a transmission signal is allowed to travel in a conductive path from the terminal T2 to the terminal ANT2 (see a broken-line arrow mark in FIG. 4), for example, since the RF signal attempts to flow into the terminal T2 side of the switch circuits SW21 and SW23, the terminal ANT2 side of the switch circuits SW12 and SW32, and the terminal T2 side of the switch circuit SW20, relatively large voltages are applied thereto.

As discussed above, relatively large voltages can be applied to the switch circuits SW11 to SW13, SW21 to SW23, and SW31 to SW33 from both terminal sides thereof when these switch circuits are turned off. As such, by applying the configuration of the bidirectional switch circuit 1 to the switch circuits SW11 to SW13, SW21 to SW23, and SW31 to SW33, the withstand voltages are enhanced with respect to the RF signal traveling in the conductive paths in both directions, thereby making it possible for the embodiment of the present disclosure to function preferably.

Although a relatively large voltage is applied to one end of each of the switch circuits SW10, SW20, and SW30, the other end of each thereof is grounded. Accordingly, in the switch device 100, a switch circuit in which the capacitance values of the capacitance elements connected in parallel to each of the FETs are so adjusted as to decrease from one end side toward the other end side may be applied in place of the bidirectional switch circuit 1, for example.

Further, the number of the terminals T1 to T3 and the number of the terminals ANT1 to ANT3 are not limited thereto, and they may be one, two, or no less than four. Furthermore, although an example in which all combinations of the terminals T1 to T3 and the terminals ANT1 to ANT3 are connected is illustrated in FIG. 4, it is not absolutely necessary to connect all the combinations thereof.

FIG. 5 illustrates an example of a case in which the bidirectional switch circuit 1 is applied to a two-input two-output (Double-Pole Double-Throw (DPDT)) switch. A switch device 200 causes a path from a terminal P1 to a terminal P3 and a path from a terminal P2 to a terminal P4 to be conductive (see solid-line arrow marks in FIG. 5) or causes a path from the terminal P1 to the terminal P4 and a path from the terminal P2 to the terminal P3 to be conductive (see broken-line arrow marks in FIG. 5).

Specifically, the switch device 200 includes switch circuits SW40a, SW40b, SW41a, SW41b, SW42a, SW42b, SW43a, SW43b, and SW50 to SW53. Although the switch circuits SW40a and SW40b, for example, are illustrated as two switch circuits in FIG. 5, switch-on and switch-off operations thereof are the same. Therefore, these switch circuits can be considered as one switch circuit (hereinafter, the switch circuits SW40a and SW40b are collectively called a "switch circuit SW40" as well). The same explanation can be applied to other switch circuits SW41, SW42, and SW43.

In the case where the switch device 200 causes the path from the terminal P1 to terminal P3 and the path from the terminal P2 to terminal P4 to be conductive, for example, the switch circuits SW40, SW41, SW52, and SW53 are turned on while the other switch circuits are turned off. At this time, since an RF signal attempts to flow into the terminal P1 side and the terminal P4 side of the switch circuit SW42, the terminal P2 side and the P3 side of the switch circuit SW43, and the signal path side of each of the switch circuits SW50 and SW51, relatively large voltages are applied thereto (see circle marks in FIG. 5). In other words, relatively large voltages can be applied to the switch circuits SW42 and SW43 from both terminal sides thereof. Likewise, in the case where the switch device 200 causes the path from the terminal P1 to terminal P4 and the path from the terminal P2 to terminal P3 to be conductive, for example, relatively large voltages can be applied to the switch circuits SW40 and SW41 from both terminal sides thereof. As such, by applying the above-discussed configuration of the bidirectional switch circuit 1 to the switch circuits SW40 to SW43, the withstand voltages are enhanced with respect to the RF signal traveling in the conductive paths in both directions, thereby making it possible for the embodiment of the present disclosure to function preferably. In the case where the configuration of the bidirectional switch circuit 1 is applied to the switch circuit 40, for example, a connection point between the switch circuit 40a and the switch circuit 40b corresponds to the above-mentioned center of the FETs, and the capacitance values of the capacitance elements become symmetric with respect to the above connection point as a reference position.

Although a relatively large voltage is applied to one end of each of the switch circuits SW50 to SW53, the other end of each thereof is grounded. Accordingly, in the switch device 100, a switch circuit in which the capacitance values of the capacitance elements connected in parallel to each of the FETs are so adjusted as to decrease from the signal path side toward the ground side may be applied in place of the bidirectional switch circuit 1, for example.

Note that the configurations of the switch devices 100 and 200 respectively illustrated in FIGS. 4 and 5 are merely examples, and configurations to which the bidirectional switch circuit 1 is applied are not limited thereto.

Thus far, exemplary embodiments of the present disclosure have been described. The bidirectional switch circuit 1 includes the FETs 21 to 26 connected in series between the terminal 10 and the terminal 12, and the capacitance elements 31 to 34 respectively connected in parallel to the FETs 21, 22, 25, and 26. The capacitance value for the capacitance element 31 or 32 of whichever position is closer to the terminal 10 is larger, and the respective capacitance value for the capacitance element 33 or 34 of whichever position is closer to the terminal 12 is larger. Adjusting the capacitance values of the capacitance elements 31 to 34 in this manner compensates for a difference in impedance due to the parasitic capacitance of the FETs, thereby making it possible to suppress an increase in voltage across the source and drain of each of the FETs close to the terminal from which the RF signal is supplied. As such, with the bidirectional switch circuit 1, the withstand voltage can be enhanced.

Although the capacitance values of the capacitance elements are not limited to any specific values, of the capacitance elements on one terminal side, at least one capacitance element may have the same capacitance value as that of the corresponding capacitance element on the other terminal side, for example.

Further, in the bidirectional switch circuit 1, the number of stages of the capacitance elements 31 and 32 on the terminal 10 side is equal to the number of stages of the capacitance elements 33 and 34 on the terminal 12 side, and the capacitance values of these capacitance elements are symmetric taking the center of the FETs as a reference position. Accordingly, regardless of the directions in which the RF signal is supplied, a rise in voltage across the source and drain of each of the FETs close to the terminal through which the RF signal is supplied can be equally suppressed, thereby making it possible to enhance the withstand voltage.

Furthermore, although the number of stages of the capacitance elements connected in parallel to each of the FETs is not limited to any specific one, the total number of capacitance elements may be smaller than the total number of FETs, and as illustrated in FIG. 1, there may be an FET to which no capacitance element is connected near the center of the FETs, for example.

In a plan view of the principal surface of the substrate where the bidirectional switch circuit 1 is formed, there are formed the overlap regions R1 to R4 in each of which the drain electrode and the source electrode extend in a direction parallel to the X-axis direction, and the drain electrode and the source electrode overlap with each other in the Y-axis direction. With this, electric charge is accumulated between the drain electrode and the source electrode so that the capacitance elements 31 to 34 as illustrated in FIG. 1 are formed. Accordingly, the bidirectional switch circuit 1 can be formed relatively easily with a configuration not including the capacitance elements 31 to 34, while suppressing the increase in the circuit area.

Further, in the bidirectional switch circuit 1, the respective width for the overlap regions R1 to R4 of whichever position is closer to the terminal 10 or 12 in the direction parallel to the X-axis direction is longer. This makes it possible for the capacitance values of the capacitance elements connected to the FETs close to the terminal 10 or 12 to be increased in the FET group G1 and G2.

Furthermore, in the bidirectional switch circuit 1, the width of the overlap region R1 as the first overlap region counted from the terminal 10 side is substantially equal to the width of the overlap region R4 as the first overlap region counted from the terminal 12 side, and the width of the overlap region R2 as the second overlap region counted from the terminal 10 side is substantially equal to the width of the region R3 as the second overlap region counted from the terminal 12 side. With this, regardless of the directions in which the RF signal is supplied, the rise in voltage across the drain and source of each of the FETs close to the terminal from which the RF signal is supplied is equally suppressed, thereby making it possible to enhance the withstand voltage.

Although the number of stages of the capacitance elements connected in parallel to the FETs is not limited to any specific one, the total number of capacitance elements may be smaller than the total number of FETs, and as illustrated in FIG. 3, there may be an FET not including a region in which the drain electrode and the source electrode overlap with each other, for example.

Although the configuration to which the bidirectional switch circuit 1 is applied is not specifically limited, the bidirectional switch circuit 1 may be used in a three-input three-output switch device, for example.

The above-discussed embodiments are aimed at facilitating the understanding of the present disclosure and are not intended to limit the interpretation of the present disclosure. Modifications or improvements can be made on the present disclosure without departing from the spirit of the disclosure, and equivalents thereof are also included in the present disclosure. That is, the products obtained by making appropriate design changes on the embodiments by those skilled in the art are also included in the scope of the present disclosure as long as the products are provided with the features of the present disclosure. For example, the constituent elements included in the respective embodiments, and the layout, materials, conditions, shapes, sizes, and the like thereof are not limited to the aforementioned examples and can be appropriately changed. In addition, the constituent elements included in the respective embodiments can be combined as long as they are technically possible to be combined, and the products obtained by combining such constituent elements are also included in the scope of the present disclosure as long as the obtained products encompass the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bidirectional switch circuit comprising:
   at least L stages of field-effect transistors (FETs) connected in series with each other between a first terminal and a second terminal, and configured to control electric conduction of a signal in both directions between the first terminal and the second terminal; and
   a plurality of capacitance elements, wherein:
   L is at least three,
   the at least L stages of FETs includes a first FET that is closest to the first terminal and a second FET that is closest to the second terminal,
   the plurality of capacitance elements comprises a first capacitance element connected in parallel with the first FET, and a second capacitance element connected in parallel with the second FET, and
   capacitance values of the plurality of capacitance elements are greatest for capacitance elements closest to the first and second terminals.

2. The bidirectional switch circuit according to claim 1, wherein:
   the at least L stages of FETs includes a first FET group comprising the first FET, and a second FET group comprising the second FET,
   the plurality of capacitance elements includes a first capacitance element group comprising M stages of capacitance elements including the first capacitance element, and a second capacitance element group comprising N stages of capacitance elements including the second capacitance element,
   each of the M stages of capacitance elements of the first capacitance element group is connected in parallel with a respective FET of the first FET group, and each of the N stages of capacitance elements of the second capacitance element group is connected in parallel with a respective FET of the second FET group,
   M is less than L, and
   N is no greater than L-M.

3. The bidirectional switch circuit according to claim 2, wherein:
   M equals N,
   a capacitance value of a k-th capacitance element of the first capacitance element group as counted from the first terminal, is equal to a capacitance value of a k-th capacitance element of the second capacitance element group as counted from the second terminal, and
   k is at least one and no more than M.

4. The bidirectional switch circuit according to claim 2, wherein the number of stages of FETs in the L stages of FETs and the number of stages of the capacitance elements included in the first capacitance element group and the second capacitance element group satisfy a relation of L>(M+N).

5. The bidirectional switch circuit according to claim 3, wherein the number of stages of FETs in the L stages of FETs and the number of stages of the capacitance elements included in the first capacitance element group and the second capacitance element group satisfy a relation of L>(M+N).

6. The bidirectional switch circuit according to claim 1, wherein:
   the bidirectional switch is formed on a substrate,
   in a plan view of a principal surface of the substrate, each of the FETs has a drain electrode extending in a first direction parallel to the principal surface and a source electrode extending in a direction opposite to the first direction,
   at least one the FETs is formed such that the drain electrode and the source electrode overlap with each other along a second direction that is parallel to the principal surface and orthogonal to the first direction, the overlap being in an overlap region, and
   at least one of the plurality of capacitance elements is formed by the drain electrode and the source electrode in the overlap region of a respective one of the at least one FETs.

7. The bidirectional switch circuit according to claim 2, wherein:
   the bidirectional switch is formed on a substrate, in a plan view of a principal surface of the substrate, each of the FETs has a drain electrode extending in a first direction parallel to the principal surface and a source electrode extending in a direction opposite to the first direction, at least one the FETs is formed such that the drain electrode and the source electrode overlap with each other along a second direction that is parallel to the principal surface and orthogonal to the first direction, the overlap being in an overlap region, and at least one of the plurality of capacitance elements is formed by the drain electrode and the source electrode in the overlap region of a respective one of the at least one FETs.

8. The bidirectional switch circuit according to claim 3, wherein:

the bidirectional switch is formed on a substrate, in a plan view of a principal surface of the substrate, each of the FETs has a drain electrode extending in a first direction parallel to the principal surface and a source electrode extending in a direction opposite to the first direction, at least one the FETs is formed such that the drain electrode and the source electrode overlap with each other along a second direction that is parallel to the principal surface and orthogonal to the first direction, the overlap being in an overlap region, and at least one of the plurality of capacitance elements is formed by the drain electrode and the source electrode in the overlap region of a respective one of the at least one FETs.

9. The bidirectional switch circuit according to claim 4, wherein:

the bidirectional switch is formed on a substrate, in a plan view of a principal surface of the substrate, each of the FETs has a drain electrode extending in a first direction parallel to the principal surface and a source electrode extending in a direction opposite to the first direction, at least one the FETs is formed such that the drain electrode and the source electrode overlap with each other along a second direction that is parallel to the principal surface and orthogonal to the first direction, the overlap being in an overlap region, and at least one of the plurality of capacitance elements is formed by the drain electrode and the source electrode in the overlap region of a respective one of the at least one FETs.

10. The bidirectional switch circuit according to claim 6, wherein:

a capacitance value of a capacitance element formed in the overlap region increases as a width of the overlap region parallel to the first direction increases, and a width of the overlap region is greater for capacitance elements formed by respective FETs closer to the first and second terminals.

11. The bidirectional switch circuit according to claim 7, wherein:

a capacitance value of a capacitance element formed in the overlap region increases as a width of the overlap region parallel to the first direction increases, and a width of the overlap region is greater for capacitance elements formed by respective FETs closer to the first and second terminals.

12. The bidirectional switch circuit according to claim 11, wherein:

M equals N, the width of the overlap region for a k-th capacitance element of the first capacitance element group as counted from the first terminal, is equal to the width of the overlap region a k-th capacitance element of the second capacitance element group as counted from the second terminal, and k is at least one and no more than M.

13. The bidirectional switch circuit according to claim 12, further comprising a third FET group comprising FETs of the L stages of FETs connected between the first FET group and the second FET group, wherein the FETs of the third FET group are not formed such that a drain electrode and a source electrode overlap with each other along the second direction.

14. A switch device comprising:

three input terminals;

three output terminals; and nine paths configured to electrically connect each of the three input terminals to each of the three output terminals, each of the nine paths including the bidirectional switch circuit according to claim 1.

15. A switch device comprising:

three input terminals;

three output terminals; and nine paths configured to electrically connect each of the three input terminals to each of the three output terminals, each of the nine paths including the bidirectional switch circuit according to claim 2.

16. The bidirectional switch circuit according to claim 1, wherein capacitance values of the plurality of capacitance elements are greater for capacitance elements closer to the first and second terminals.

17. The bidirectional switch circuit according to claim 2, wherein capacitance values of the plurality of capacitance elements are greater for capacitance elements closer to the first and second terminals.

18. The bidirectional switch circuit according to claim 1, wherein the signal is a radio frequency (RF) transmission signal that passes through the L stages of FETs in a first direction or is an RF reception signal that passes through the L stages of FETs in a second direction opposite the first direction.

* * * * *